United States Patent [19]
Donnelly et al.

[11] Patent Number: 5,945,862
[45] Date of Patent: Aug. 31, 1999

[54] CIRCUITRY FOR THE DELAY ADJUSTMENT OF A CLOCK SIGNAL

[75] Inventors: Kevin S. Donnelly, San Francisco; Jun Kim, Redwood City; Bruno W. Garlepp, Mountain View; Mark A. Horowitz, Menlo Park; Thomas H. Lee, Cupertino; Pak Shing Chau, San Jose; Jared L. Zerbe, Palo Alto; Clemenz L. Portmann, Cupertino; Yiu-Fai Chan, Los Altos Hills, all of Calif.

[73] Assignee: Rambus Incorporated, Mountain View, Calif.

[21] Appl. No.: 08/904,203

[22] Filed: Jul. 31, 1997

[51] Int. Cl.$^6$ .................................................. H03H 11/26
[52] U.S. Cl. .......................... 327/278; 327/241; 327/279
[58] Field of Search .................................. 327/231, 237, 327/241, 242, 258, 261, 269, 270, 271, 276, 277, 284, 278, 279

[56] References Cited

U.S. PATENT DOCUMENTS

| | | | |
|---|---|---|---|
| 4,626,716 | 12/1986 | Miki ........................................ | 307/590 |
| 4,884,041 | 11/1989 | Walker ..................................... | 331/57 |
| 5,180,994 | 1/1993 | Martin et al. ............................ | 331/38 |
| 5,451,894 | 9/1995 | Guo ........................................ | 327/241 |
| 5,475,344 | 12/1995 | Maneatis et al. ........................ | 331/57 |
| 5,485,490 | 1/1996 | Leung et al. ............................. | 375/371 |
| 5,534,808 | 7/1996 | Takaki et al. ............................ | 327/261 |
| 5,663,767 | 9/1997 | Rumreich et al. ....................... | 348/537 |
| 5,717,362 | 2/1998 | Maneatis et al. ........................ | 331/57 |

OTHER PUBLICATIONS

Tanoi et al., "A 250–622 MHz Deskew and Jitter–Suppressed Clock Buffer Using Two–Loop Architecture", *IEEE J. of Solid–State Circuits*, 31(4):487–493 (1996).

"Multifrequency Zero–Jitter Delay–Locked Loop", Avner Efendovich et al., IEEE Journal of Solid–State Circuits, vol. 29, No. 1, Jan. 1994.

"Skew Minimization Techniques for 256M–bit Synchronous DRAM and beyond", Jin–Man Han et al., IEEE Solid State Circuits Council Symposium on VLSI Circuits, Jun. 13–15, 1996.

"A 256 Mb SDRAM Using a Register–Controlled Digital DLL", Atsushi Hatakeyama et al., 1997 IEEE International Solid–State Circuits Conference, Digest of Technical Papers.

"A 2.5V Delay–Locked Loop for an 18Mb 500MB/s DRAM", Thomas H. Lee et al., IEEE International Solid–State Circuits Conference 1994, Digest of Technical Papers.

"SA 20.2: A Semi–Digital DLL with Unlimited Phase Shift Capability and 0.08–400MHz Operating Range", Stefanos Sidiropoulos et al., 1997 IEEE International Solid–State Circuits Conference, Digest of Technical Papers.

"SA 17.4: A 660MB/s Interface Megacell Portable Circuit in 0.3 $\mu$m CMOS ASIC", Kevin Donnelly et al., 1996 IEEE International Solid–State Circuits Conference, Digest of Technical Papers.

*Primary Examiner*—Kenneth B. Wells
*Assistant Examiner*—Hai L. Nguyen
*Attorney, Agent, or Firm*—Pennie & Edmonds LLP

[57] ABSTRACT

Circuitry for adjusting the phase of an incoming periodic signal, typically a clock signal, throughout the entire period of the periodic signal. Phase adjustment circuitry has high resolution and employs only the number of delay elements in a delay chain necessary to span at least the period of the incoming signal or at least half the period in the case of dual chains receiving complementary clocks. Phase adjustment circuitry includes a delay chain of having a plurality of taps, a boundary detector for indicating when a tap is at a phase boundary of the incoming periodic signal, and selection circuitry for selecting one of the taps from the delay chain based on the boundary detector output and the selection circuitry input such that the selected tap is the desired phase adjustment of the incoming periodic signal and that the delay of the incoming signal is adjustable across its phase boundaries. Phase interpolation between the taps of the delay chain is employed to increase the resolution of the adjustment to the periodic signal. Duty cycle correction of the input clock and the selected output clock is employed to improve accuracy.

16 Claims, 18 Drawing Sheets

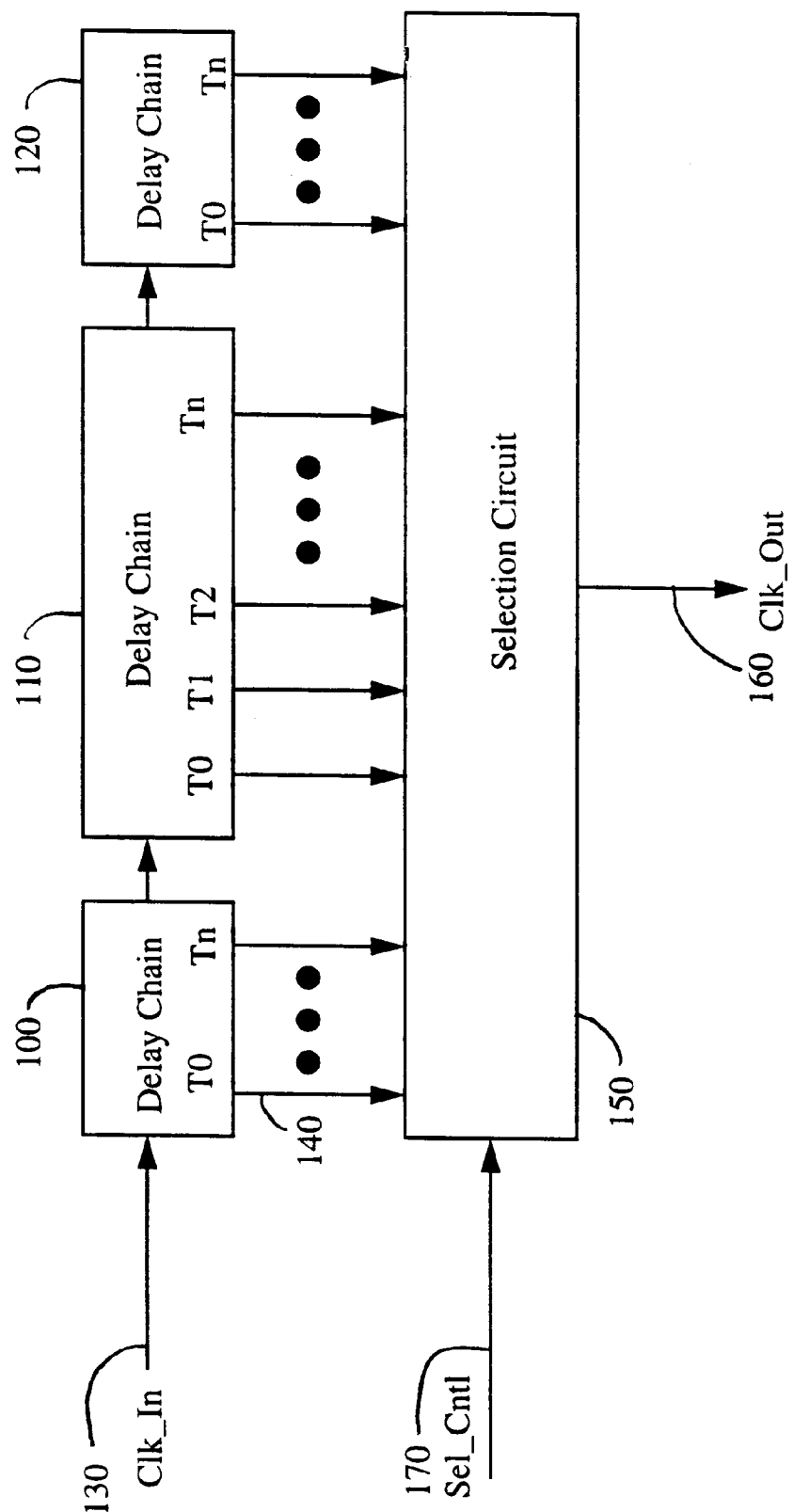
FIG_1 PRIOR ART

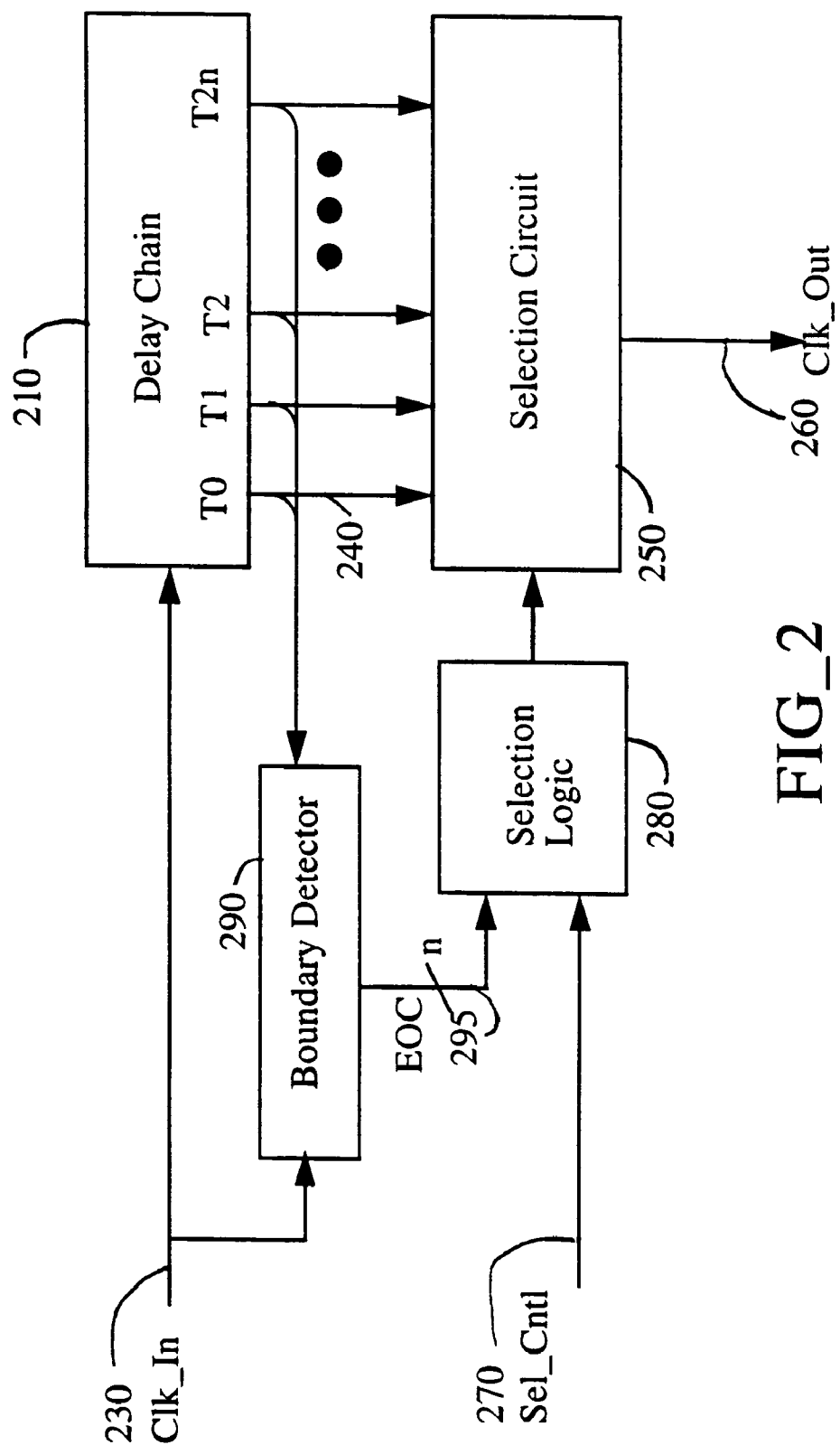
FIG_2

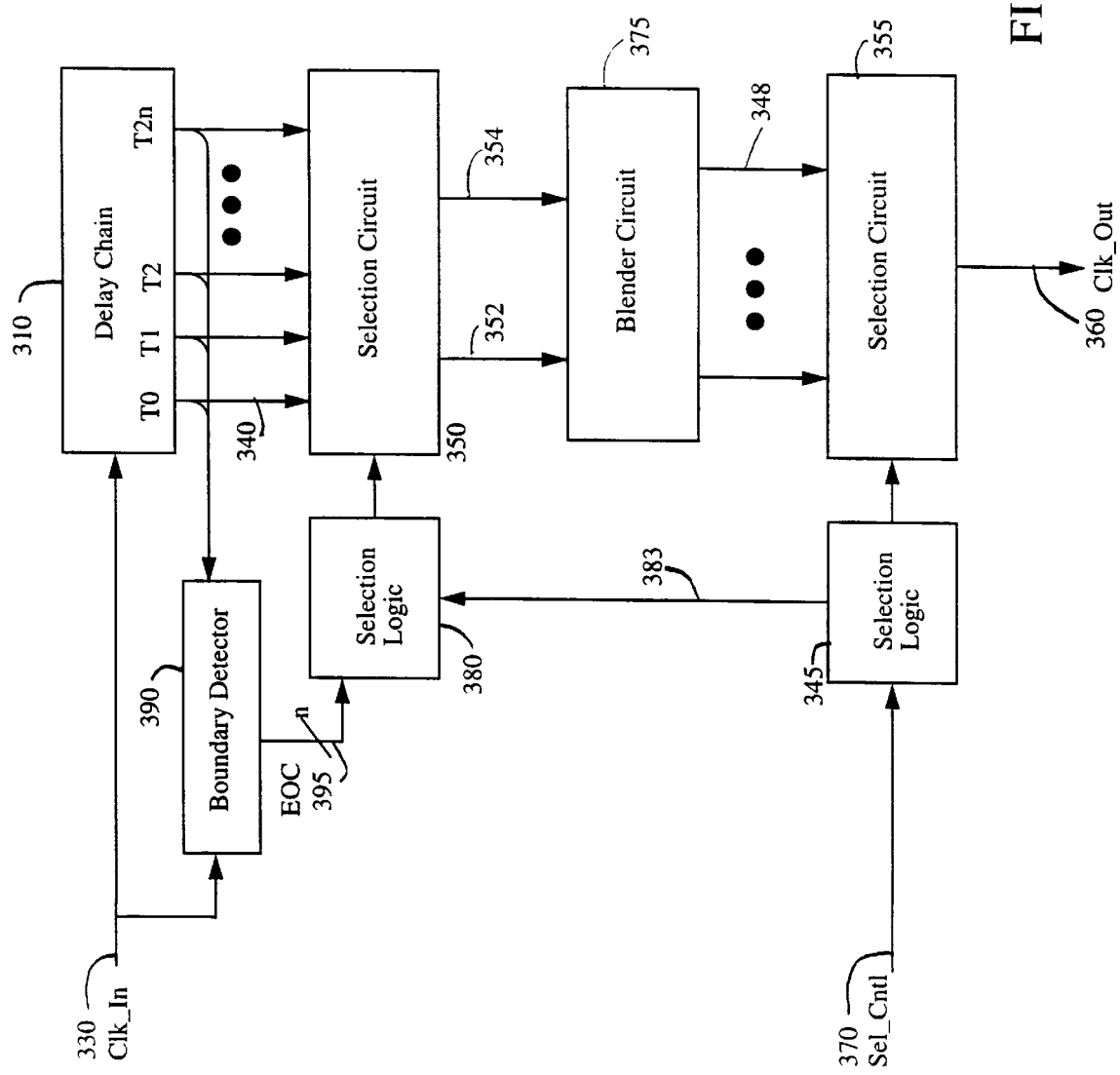
FIG_3

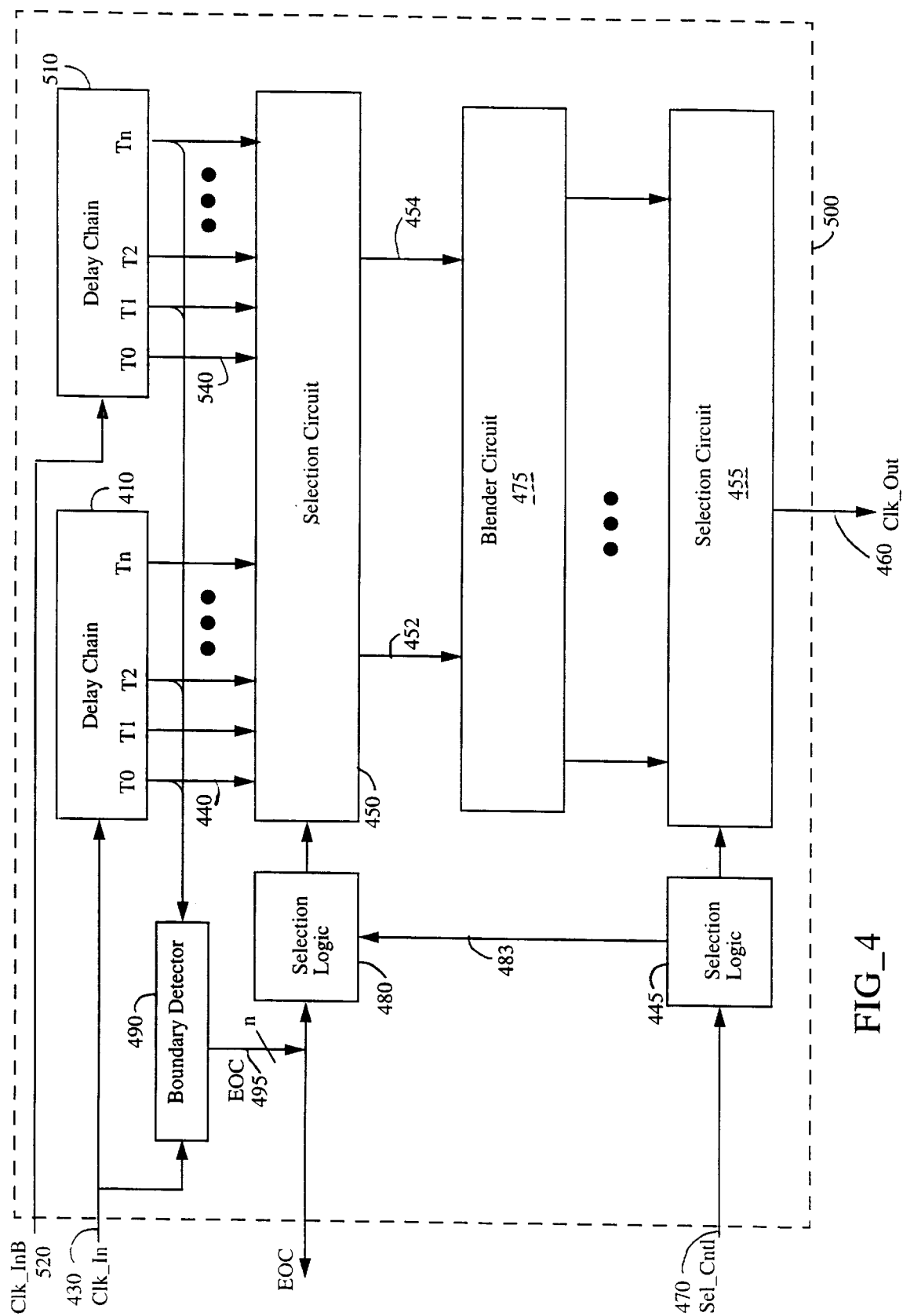
FIG_4

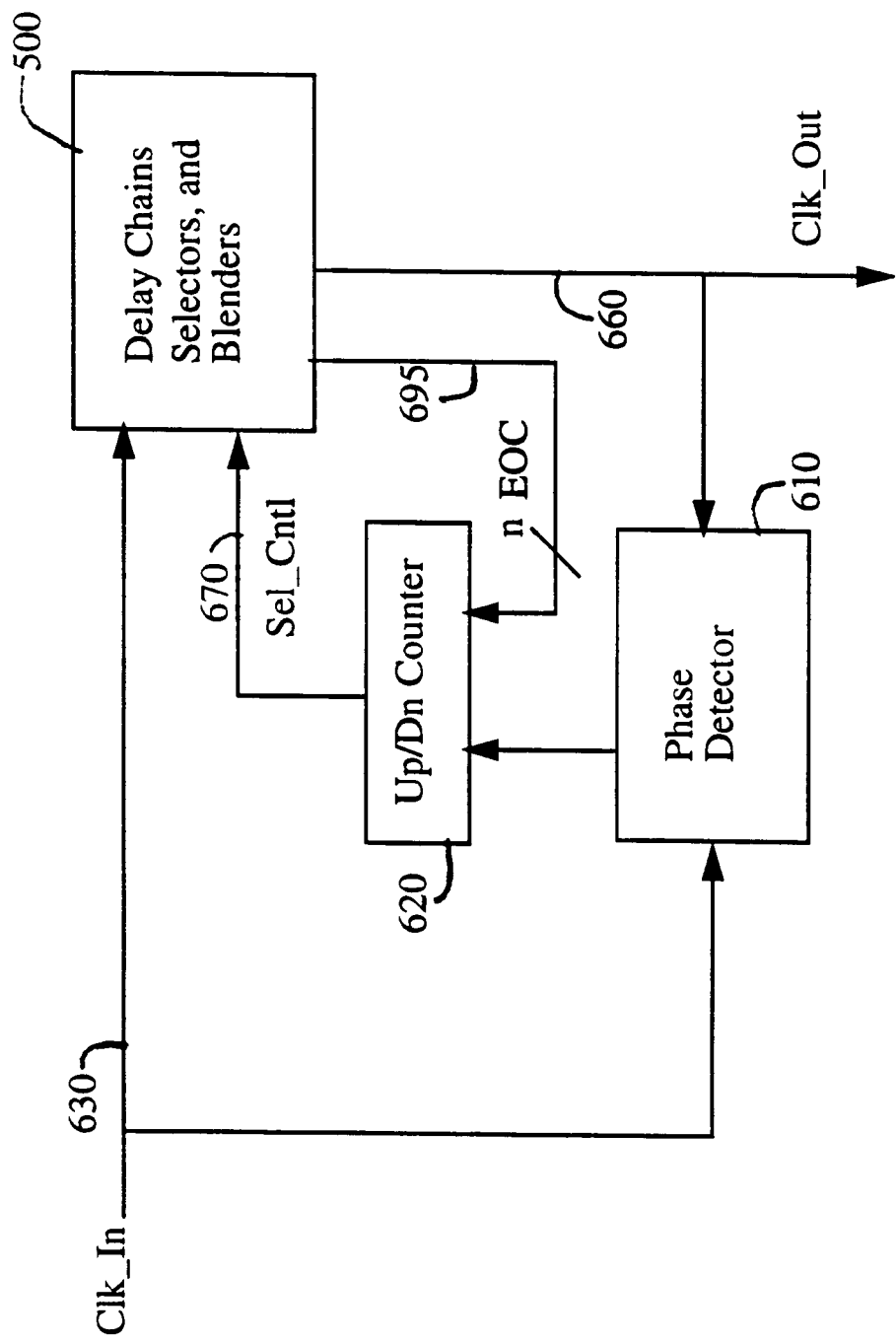
FIG_5

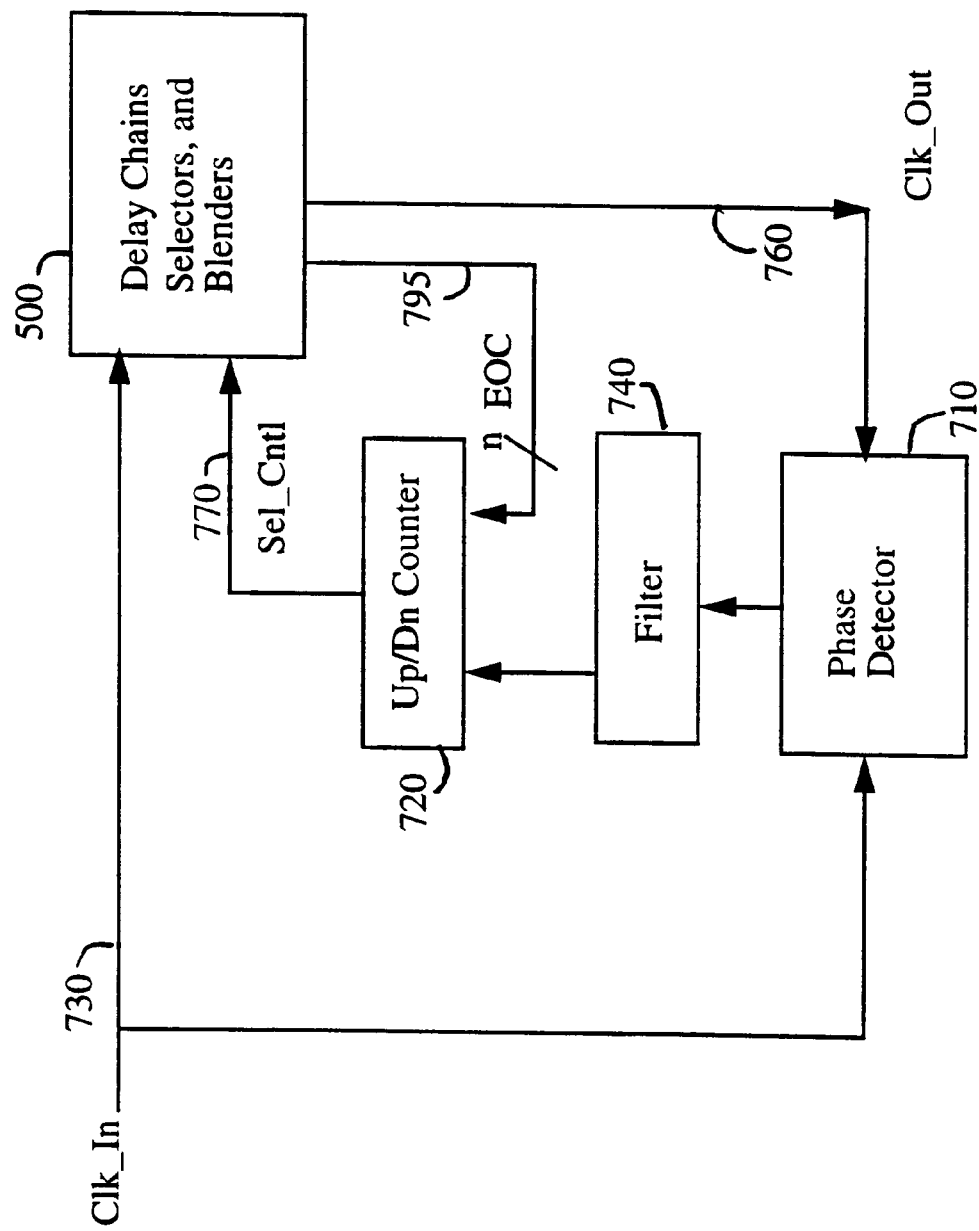
FIG_6

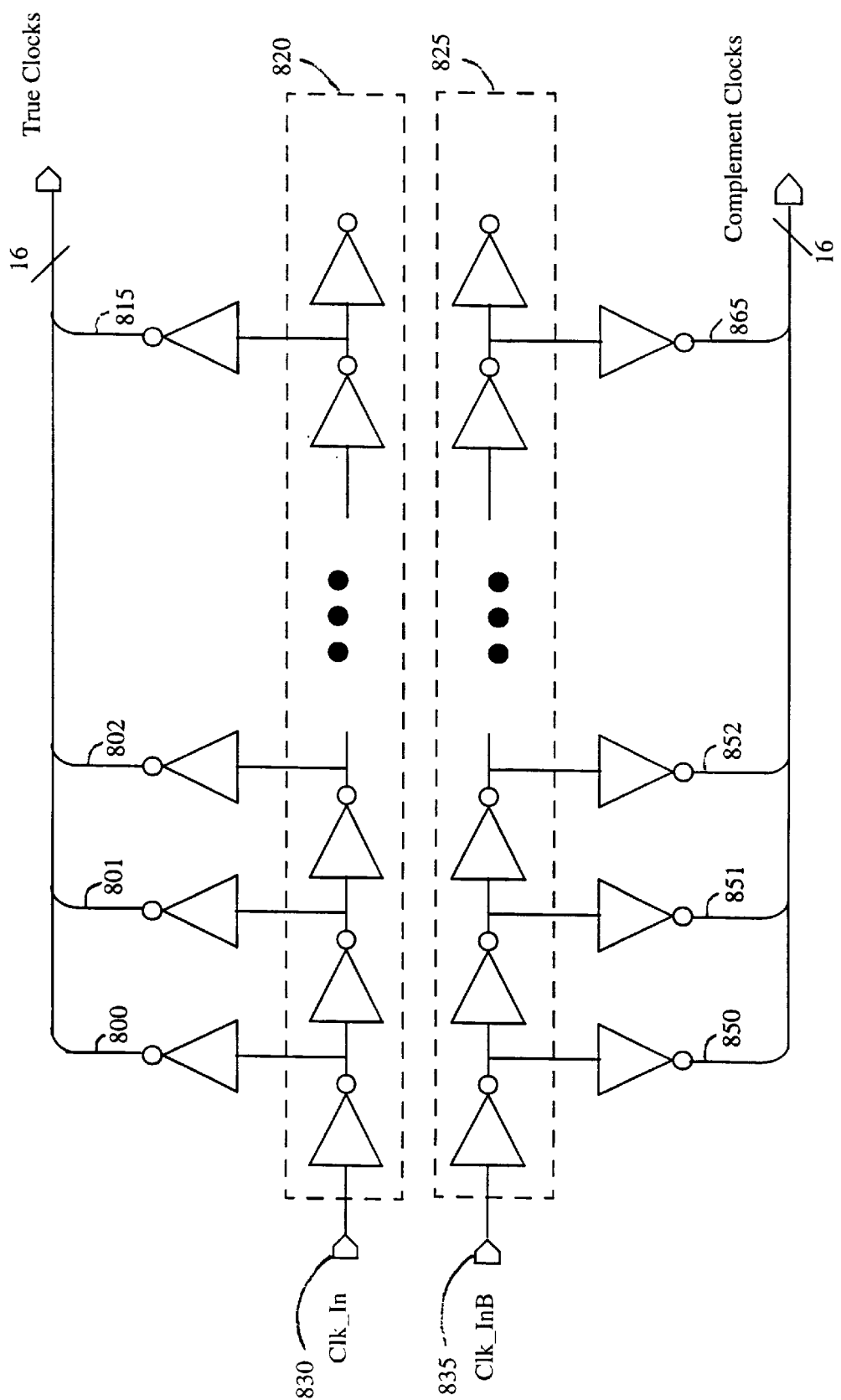
FIG_7

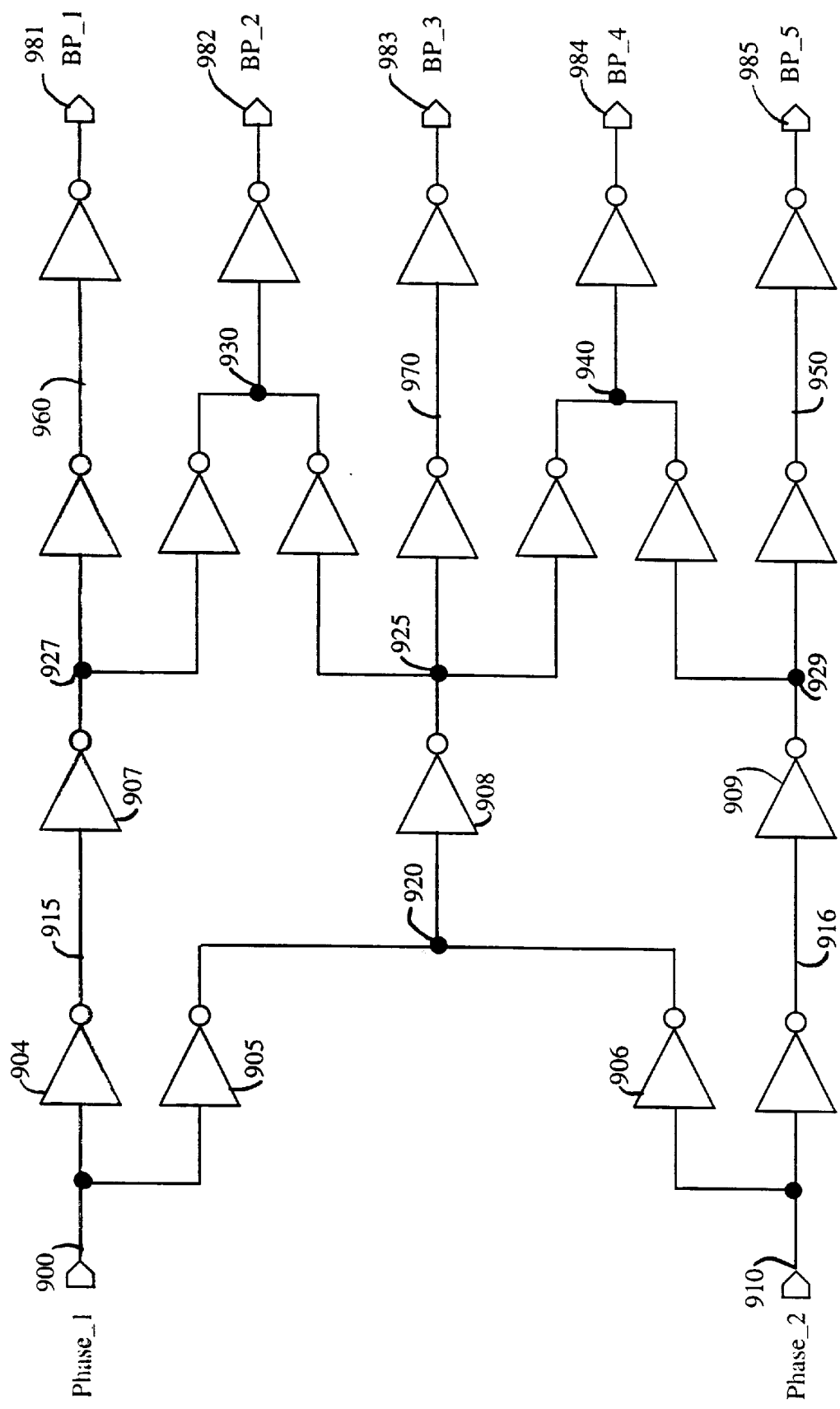
FIG_8

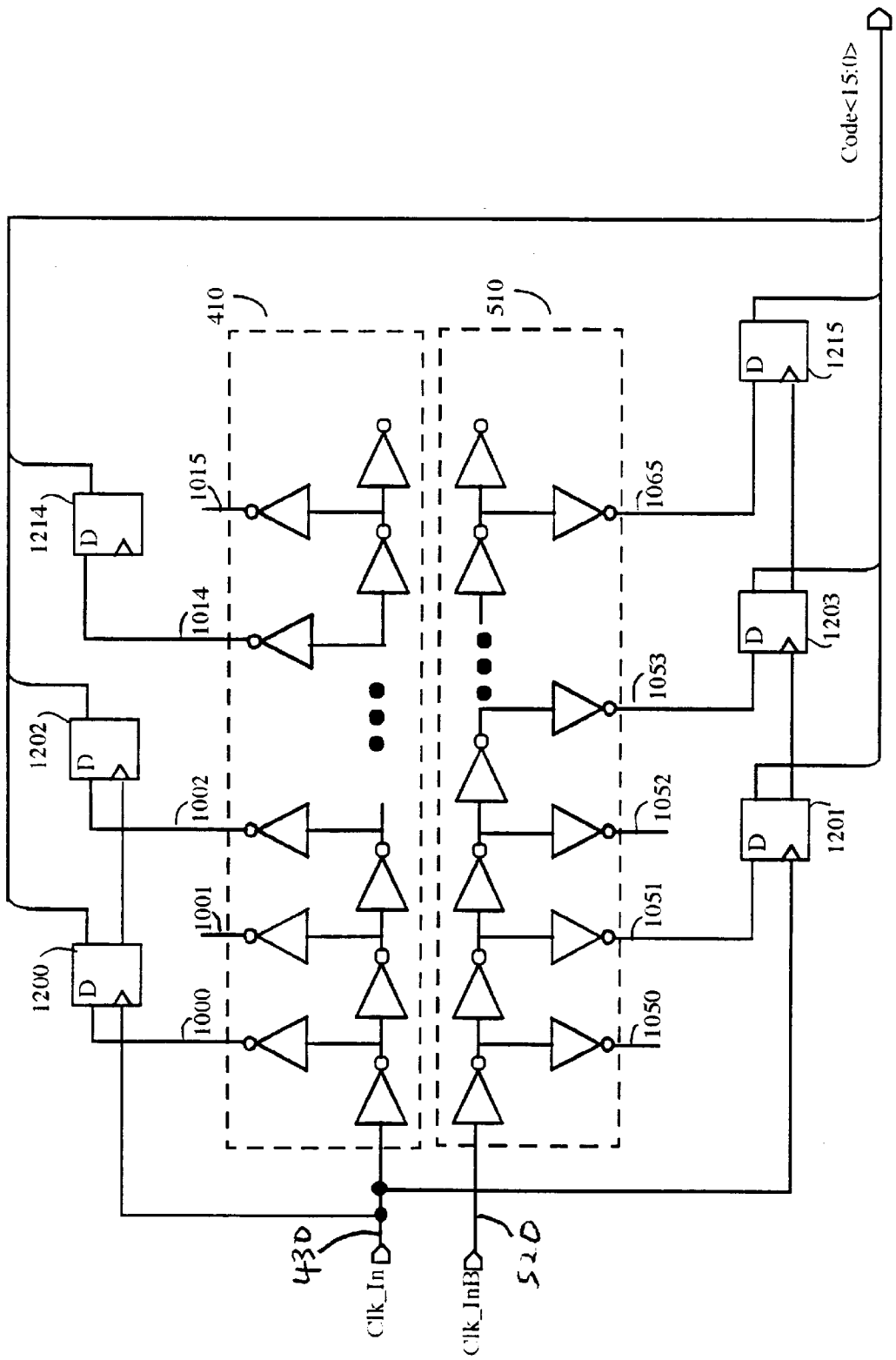
FIG_9

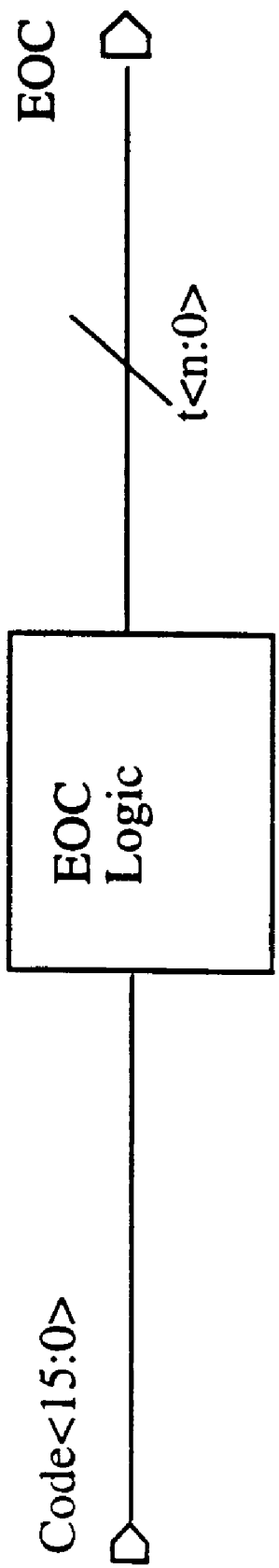
FIG_10

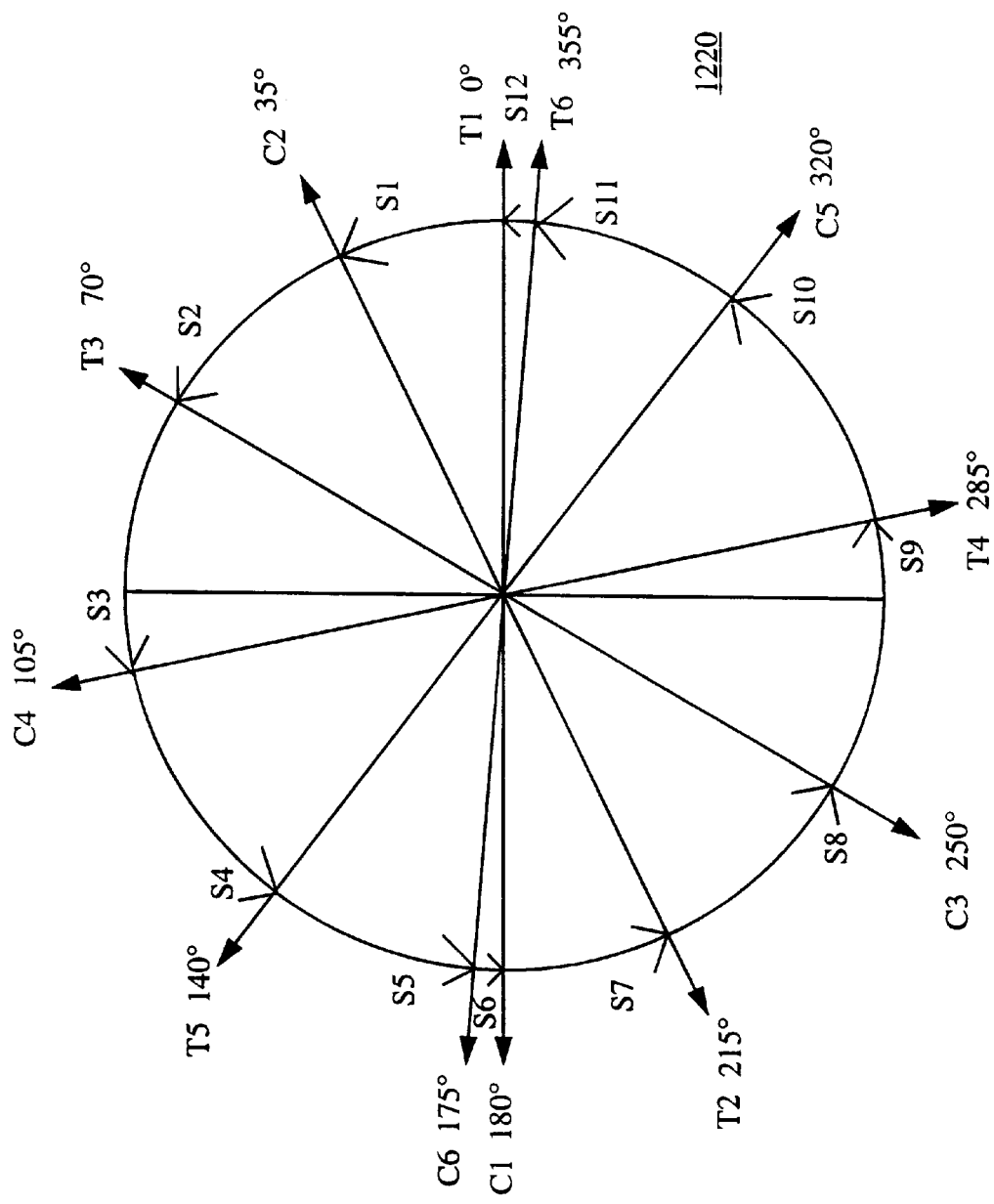
FIG_11

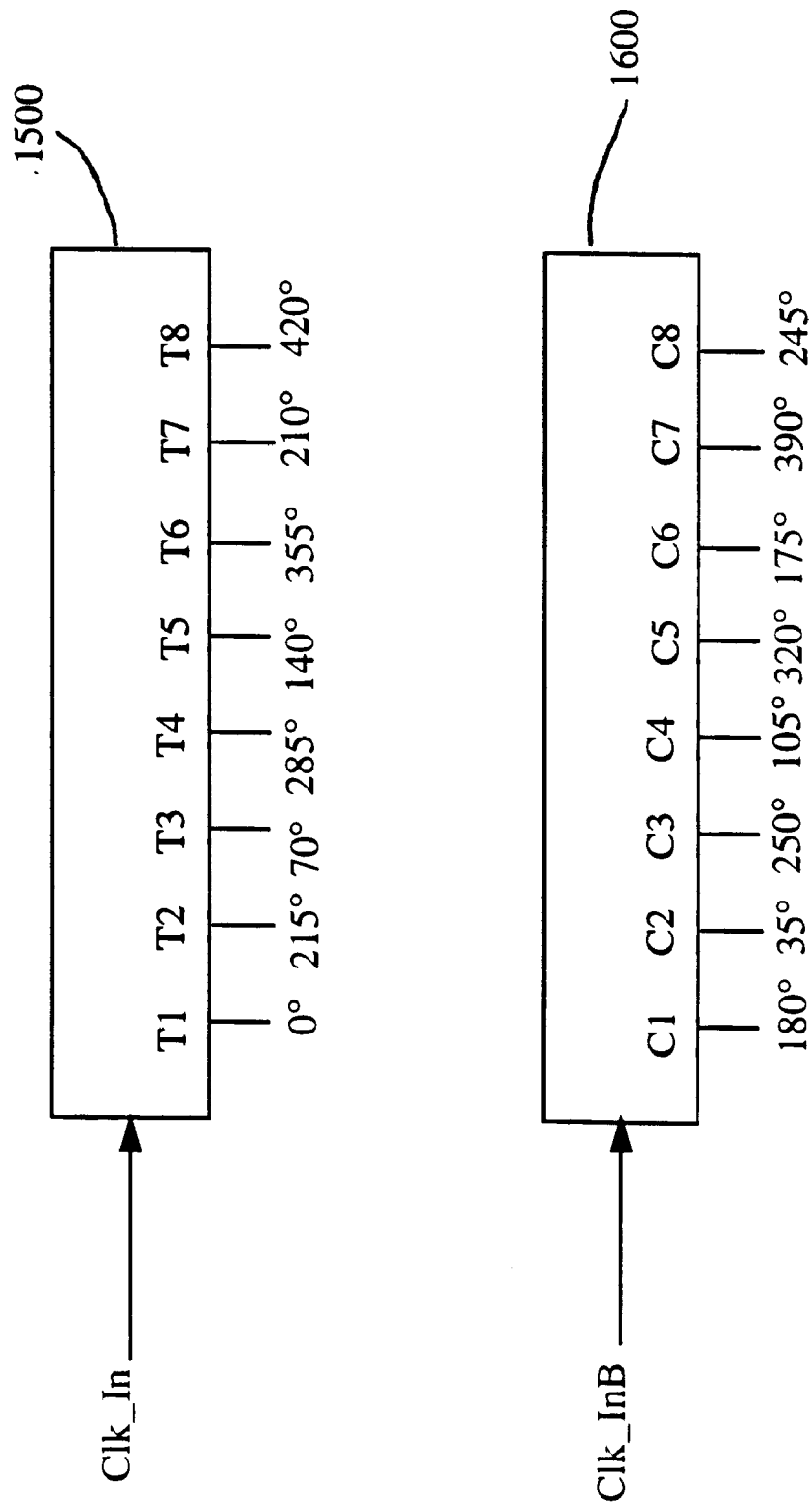
FIG_12

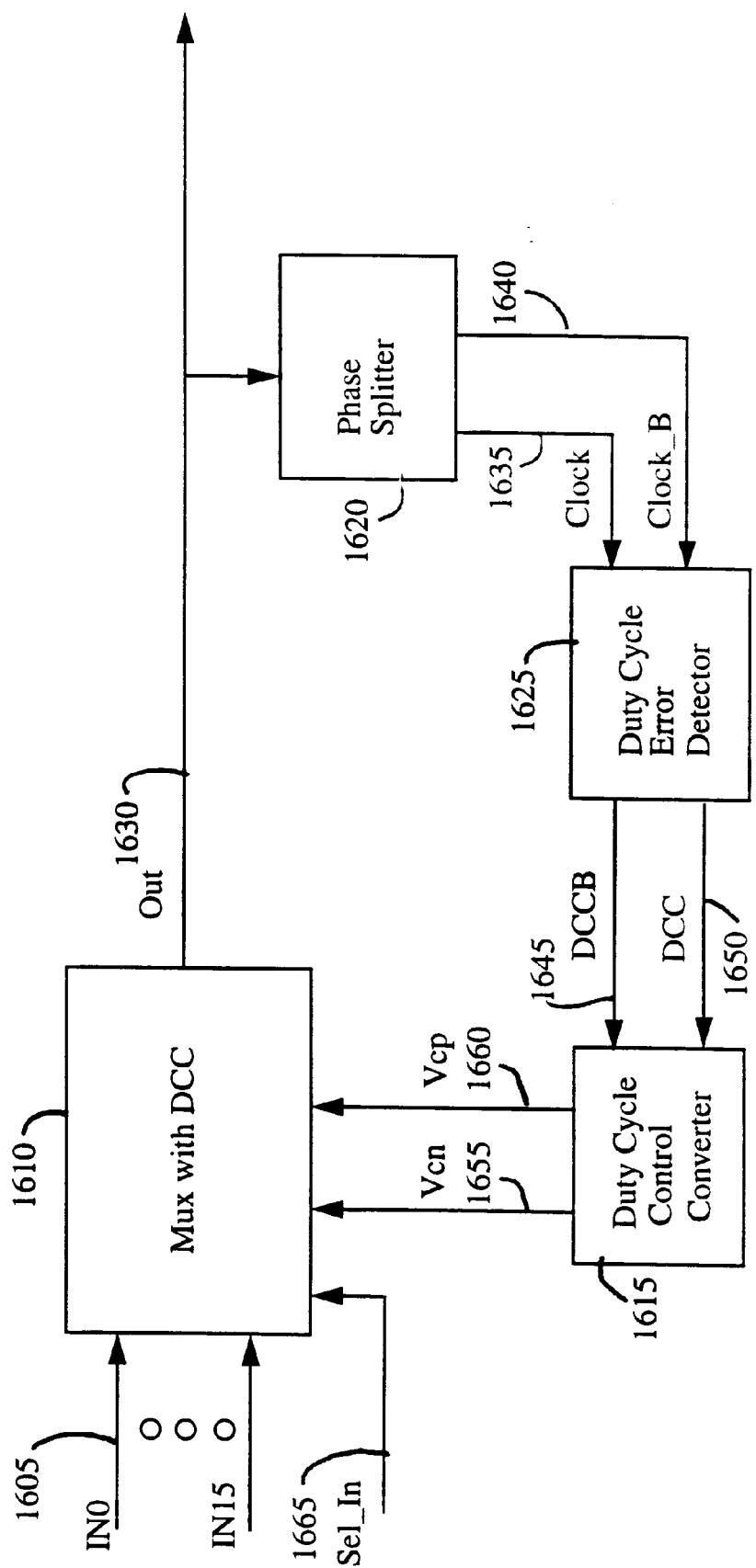
FIG_13

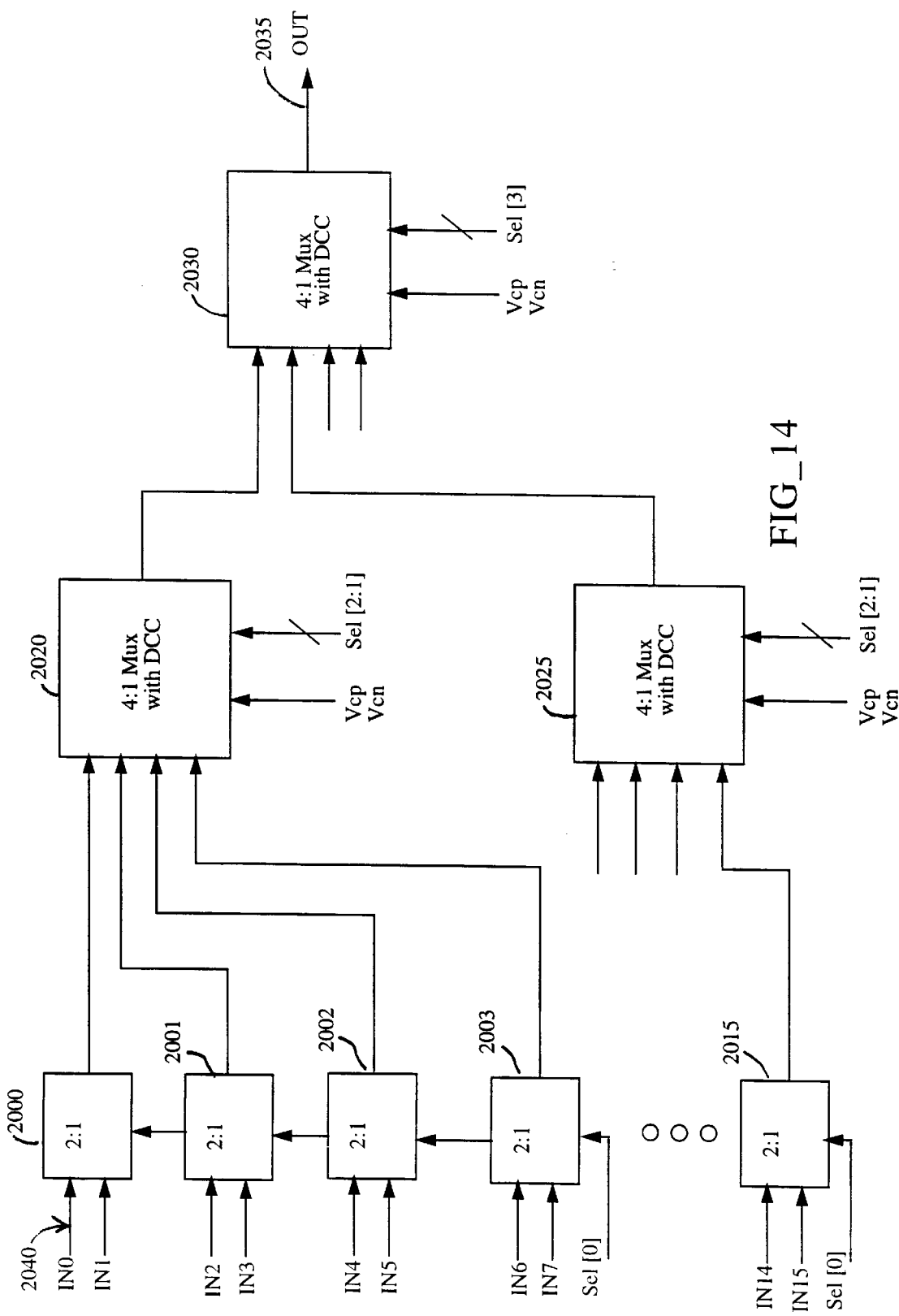
FIG_14

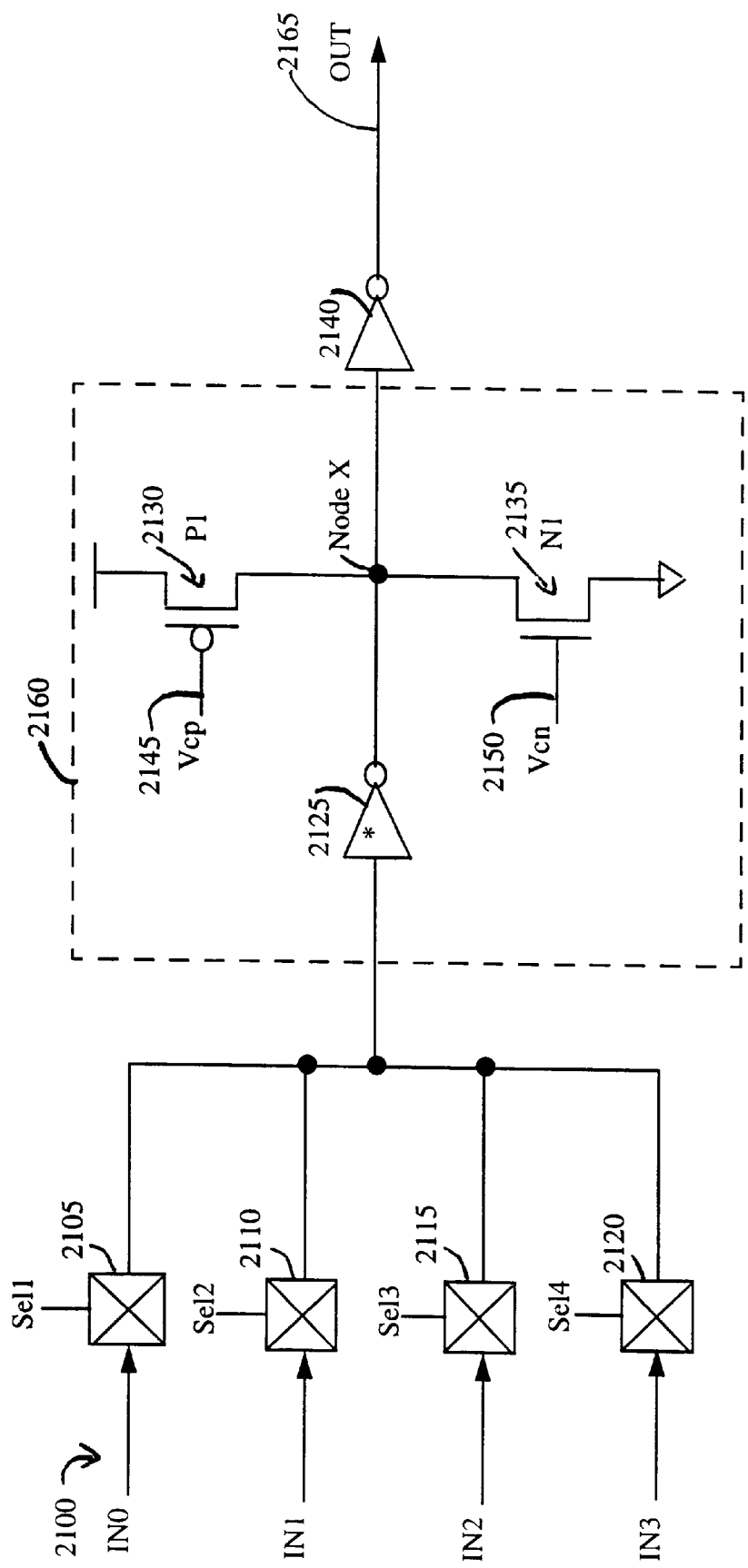
FIG_15

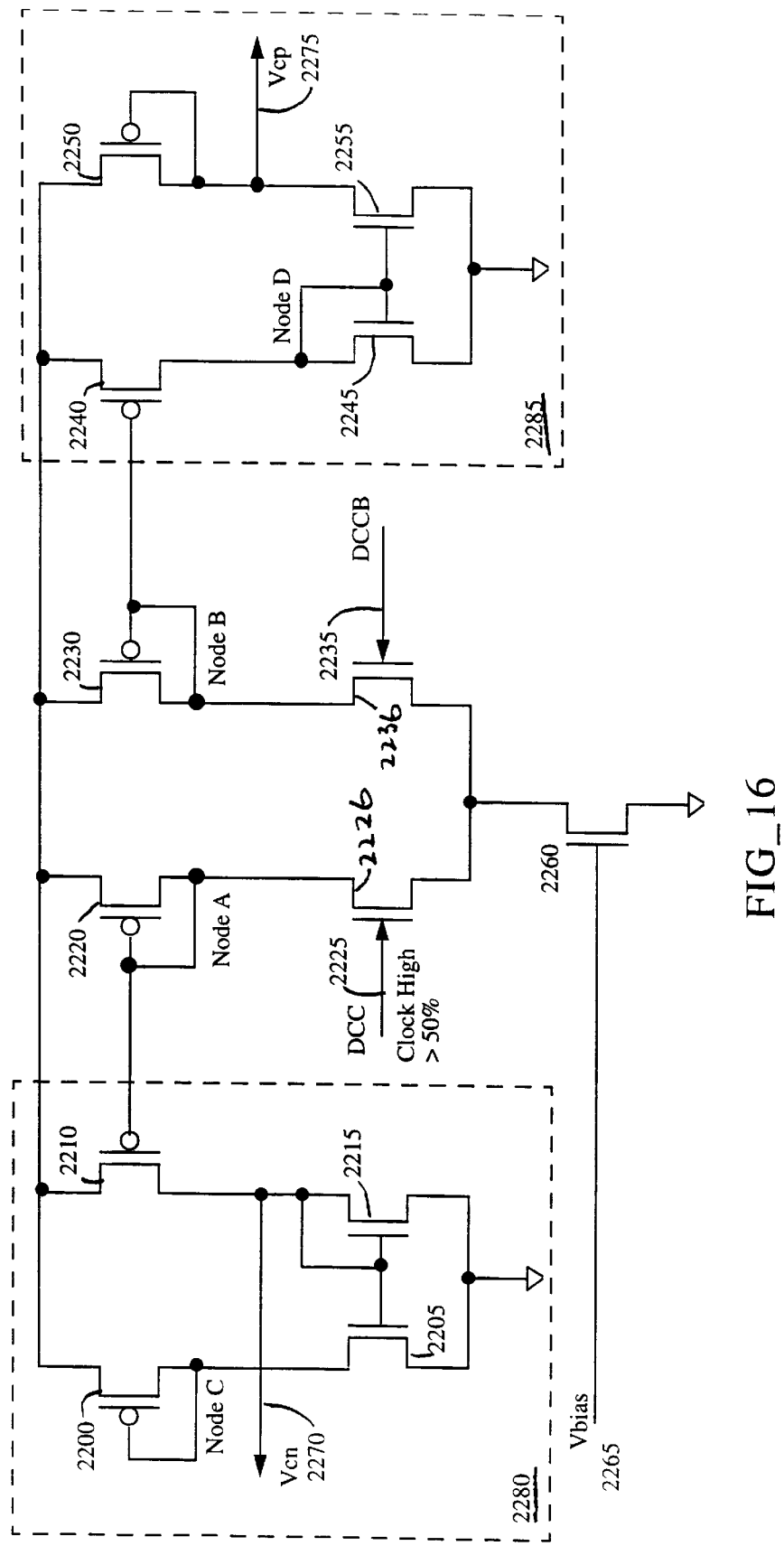
FIG_16

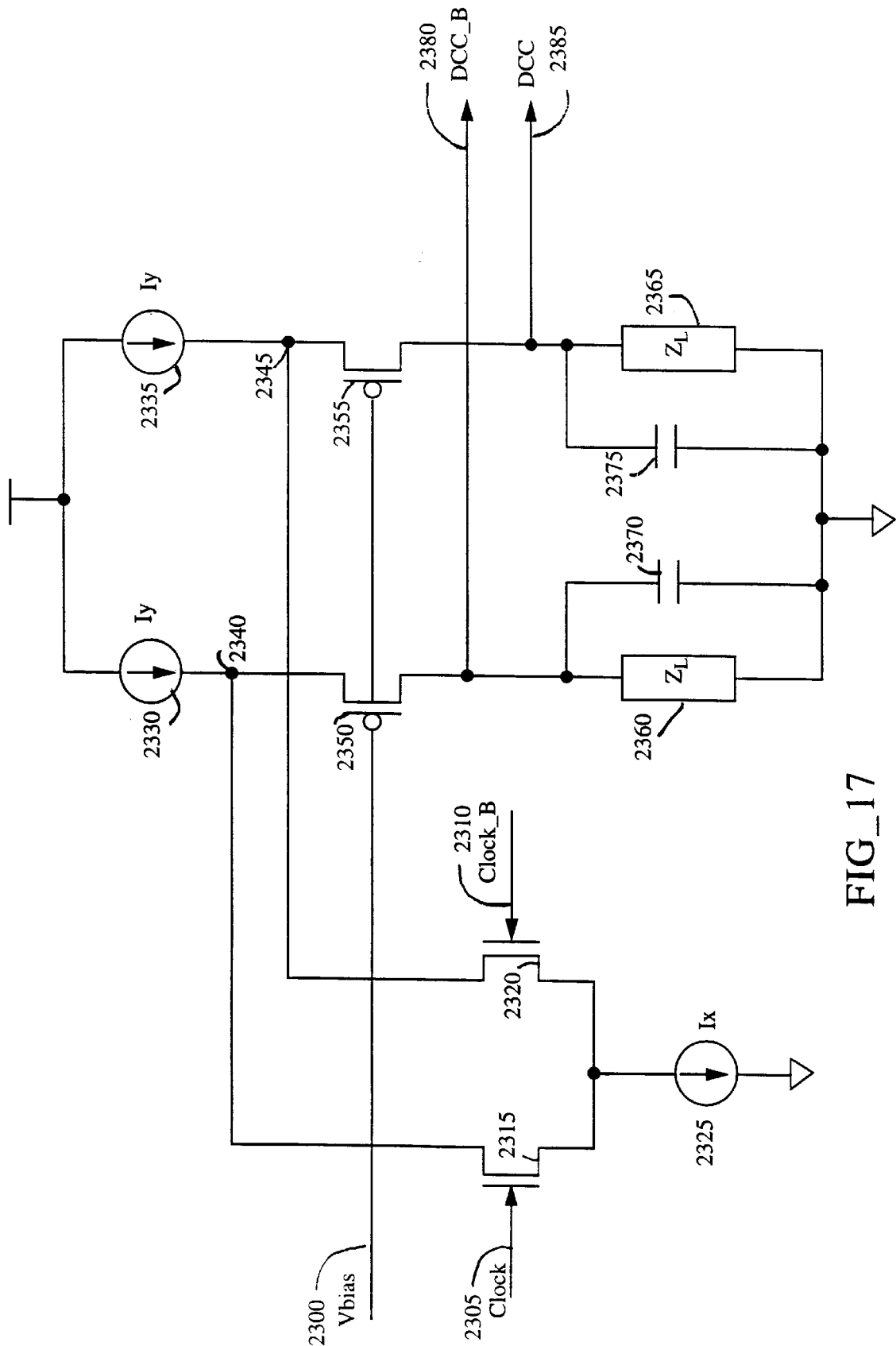
FIG_17

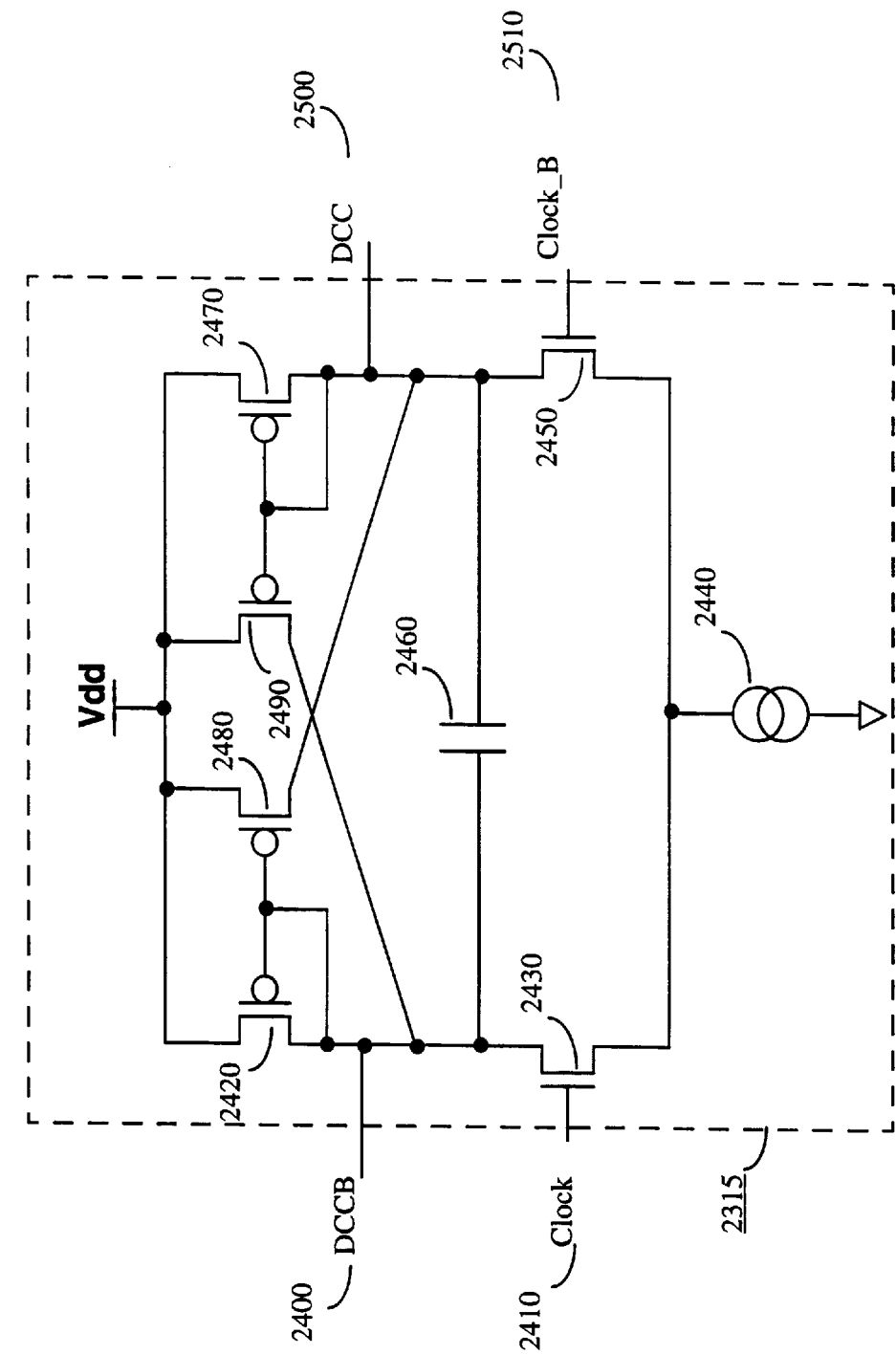
FIG_18

CIRCUITRY FOR THE DELAY ADJUSTMENT OF A CLOCK SIGNAL

FIELD OF THE INVENTION

This invention is in the field of providing adjustable delays to an incoming periodic signal. Circuitry for adjusting the delay of a clock signal is described. The circuitry is suitable for use in a delay locked loop for controlling the amount of delay adjustment to the clock signal.

BACKGROUND OF THE INVENTION

One technique of providing a 360° adjustable delay to an incoming periodic signal is to use a tapped delay line shown in FIG. 1. The tapped delay line 110 is formed of delay elements each having some nominal delay and some quantifiable variation about the nominal delay. The desired delay is produced by selecting the appropriate tap 140 using a selection circuit 150 shown. To build a tapped delay line on an integrated circuit, the delay element is usually constructed from a semiconductor logic gate or pair of logic gates fabricated according to a specific process and subject to the variations in that process as well in environmental conditions. If a tapped delay line or delay chain is formed from these delay elements and it is desirable to be able to vary the delay of the incoming signal through its entire period, i.e., 360°, the number of delay elements in chain 110 must be determined based on the fastest delay for each element to assure that delays throughout the entire period of the incoming signal are selectable.

The location of the desired tap for a particular phase adjustment may vary due to process parameters varying the actual delay through the inverters from chip to chip. In addition, the actual clock frequency could vary, which would also change the tap needed for the desired phase adjustment. At high clock speeds, even small delay variations become significant, especially if accumulated through several delay elements.

Furthermore, if the delay chosen is equal to the input or output tap of chain 110, delay chains 100 and 120, each spanning at least half a period of the incoming signal, must be added to the beginning and the end of chain 110 to cover adjustments less than 0° and greater than 360°. The result is a delay chain which has a large number of delay elements.

For example, referring to FIG. 1, if the period of incoming clock 130 is 3.2 nanoseconds (ns) and if an inverting delay element is used (as is typical in CMOS circuitry) having a delay of 100 picoseconds (ps), then each tap 140 has a delay of 200 ps because taps in FIG. 1 have the same polarity. Thus 64 inverting delay elements are required as follows. Chain 110 has 16 taps (32 delay elements) to cover the 360° period of the incoming clock. Chain 100 has 8 taps (16 delay elements) before chain 110 and chain 120 has 8 taps (16 delay elements) after chain 110 to cover adjustment at the phase boundaries of the incoming clock. The number of delay elements required is set by the fastest delay of a delay element and the largest clock period. However, the resolution of selectable delays for the output signal is determined by the slowest delay between taps. In a typical situation,the delay of one of the delay elements can vary by a factor of three between the slowest delay and the fastest delay.

Therefore, in the example above, the resolution of the selectable delays from the line is 600 ps, because two delay elements, each having a slowest delay of 300 ps, are required between each tap when using inverters as the delay elements.

Thus, the technique of a simple delay chain to provide a 360° adjustable delay to an incoming periodic signal has several drawbacks. First is that it requires a large number of delay elements to span the period of the incoming clock. The large number of elements take up a good deal of space and consume significant power. Second, it has the resolution of the slowest delay between taps. This resolution may not be acceptable for certain applications. Third, it requires additional delay elements to cover adjustments at the phase boundaries, further compounding the space and power problem. Fourth, the large number of delay elements accumulates certain errors as the signal progresses down the chain causing more noise and jitter to the signals produced by the chain at the taps. For these and other reasons it is desirable to have a technique of producing a 360° adjustable delay to an incoming periodic signal that has a small number of delay elements with better resolution than a simple tapped delay line.

SUMMARY OF THE INVENTION

A circuit is disclosed for adjusting the phase of an incoming periodic signal, typically a clock signal, throughout the entire period of the periodic signal. A delay chain with a plurality of taps is used. A boundary detector is provided to indicate which tap is at a specified phase boundary (such as 180 degrees). The boundary detector indication is used to select an appropriate tap for the desired phase adjustment.

The invention allows the use of only the number of delay elements necessary to span one period of the slowest incoming clock. The boundary detector enables detecting when the required phase adjustment is less than zero or greater than 360°, in which case the selection logic selects taps from a point in the chain at the opposite phase boundary. This permits adjustment of delays throughout the period of the incoming signal without the need for additional delay elements.

In one embodiment, a blender circuit is employed which produces better resolution than a single delay element by phase blending taps from a pair of selected outputs of the delay chain.

In another embodiment, to produce even greater resolution a pair of delay chains each spanning at least half a period and having inverters between the taps is used to provide signals to the blender. One of the chains receives the incoming clock and the other receives the complement of the incoming clock. A signal is selected from each chain and presented to the blender for interpolation, thereby producing greater resolution than a blender with one chain.

Finally, in yet another embodiment, a duty cycle correction circuit is provided in the selection logic connected to select the delay taps. Typically, the correction is applied whenever the clock signal exiting the selection logic exhibits other than a 50% duty cycle. The selection logic includes a multiplexer for selecting among the delay taps, and the pull-up and pull-down bias voltages are varied to provide duty cycle correction within the selection logic itself.

BRIEF DESCRIPTION OF THE DRAWINGS

FIG. 1 is a block diagram of an existing prior art technique for adjusting the delay of a clock signal.

FIG. 2 is a schematic block diagram showing an embodiment in which a boundary detector is employed to detect the boundaries of the delay chain.

FIG. 3 is a schematic block diagram showing an embodiment in which a blender circuit is added to improve the resolution of the adjustable delay.

FIG. 4 is a schematic block diagram showing an embodiment in which a pair of delay lines is used to improve the resolution of the adjustable delay.

FIG. 5 is a schematic block diagram of the use of any one of the embodiments in FIGS. 2, 3, or 4 in a delay locked loop.

FIG. 6 is a schematic block diagram of the delay locked loop shown in FIG. 5 with the addition of a loop filter.

FIG. 7 shows an embodiment of the circuitry for generating the delay chains of FIG. 4.

FIG. 8 depicts an embodiment of a blender circuit shown in FIGS. 3 or 4.

FIG. 9 depicts an embodiment of a boundary detector circuit for use in FIGS. 2, 3 or 4.

FIG. 10 shows the EOC logic used in conjunction with FIG. 9.

FIG. 11 is a phase diagram depicting the phases of the various taps of the delay chains in FIG. 4.

FIG. 12 shows the various phases of the taps of the true and complement chains for the phases shown in FIG. 11.

FIG. 13 is a block diagram of the duty cycle correcting selection circuit.

FIG. 14 shows an embodiment of circuitry for the multiplexor with DCC block shown in FIG. 13.

FIG. 15 shows an embodiment of circuitry for the 4:1 multiplexor with DCC shown in FIG. 14.

FIG. 16 is an embodiment of circuitry for the duty cycle control converter of FIG. 13.

FIG. 17 shows an embodiment of duty cycle error detector shown in FIG. 13.

FIG. 18 shows another embodiment duty cycle error detector shown in FIG. 13.

DESCRIPTION OF THE PREFERRED EMBODIMENT

FIG. 2 shows an embodiment of the invention using a boundary detector to create the end of cycle signal for informing the selection logic of the presence of a phase boundary. In FIG. 2, a delay chain 210 is depicted and its taps 240 are connected to a selection circuit 250 which is controlled by selection logic 280. Selection logic 280 receives an input Sel_Cntl 270, from other circuitry, such as a phase detector, and inputs, EOC 295, from the output of boundary detector 290. The boundary detector has the function of determining, based on the input clock 230 and the taps of the delay chain 240, when a delay chain tap is at a phase boundary of either 0° and either 180° or 360°, depending on the embodiment. When selection logic 280 receives an instruction from the Sel_Cntl 270 input to select a specific tap from the delay chain it also takes into account the value of the EOC 295 indicator. If the tap to be selected is beyond the 0° or 360° (180°) phase boundary the selection logic determines that it should choose a tap from the delay chain at the opposite phase boundary. By doing so, any phase adjustment including an adjustment through 0° or 360° (180°) is possible without the need for extra delay stages. Assuming that taps 240 have the same polarity and pairs of inverters are used between taps, only 32 delay elements (instead of 64) are required given the above example discussed in connection with FIG. 1. The resolution of the circuit shown in FIG. 2 is equal to the slowest delay between taps from the delay chain. If the slowest delay of an inverter is 300 ps, then Clk_Out produced by the selection circuit has a resolution of 600 ps, because the phase of the output clock can only be changed in increments of this amount.

FIG. 3 improves the resolution obtainable from the circuit in FIG. 2 by adding a blender circuit 375 to selection circuit 350. The blender circuit 375 receives a pair of selected outputs 352 and 354 from selection circuit 350 and interpolates between taps having the same polarity to create a number of output taps 348 with approximately equal phase steps spanning the phase between the inputs 352 and 354. For example, if the two inputs are 600 ps apart, then a blender with four outputs, has each output 348 delayed 150 ps from an adjacent output. A second selection circuit 355 receives the output taps 348 and receives control information from selection logic 345. Selection logic 345 receives instructions for making a selection of one of the taps 348 of the blender circuit from signal Sel_Cntl 370, which is derived from other circuitry such as a phase detector. Selection logic 345 has an additional function besides the selection of one of the blender outputs. It must also inform selection logic 380, via signal 383, that a different pair of taps is required from the delay chain when the adjustment requested is outside of the range provided by the current pair of delay chain taps. As before, selection logic 380 will adjust the selected taps for the blender inputs taking into account the value of the EOC 395 information provided by the boundary detector. Thus, the resolution of the circuit of FIG. 2 is improved from 600 ps to 150 ps in the example given. An embodiment of a blender circuit suitable for use in FIG. 3 is shown and discussed below in connection with FIG. 8.

FIG. 4 further improves the resolution of the circuit again by using a pair of delay chains 410 and 510, each chain being constructed from inverting delay elements. One delay chain 410 receives and propagates signal Clk_In 430 to produce the true outputs 440 spanning at least 180° of Clk_In 430 and the other delay chain 510 receives and simultaneously propagates signal Clk_InB 520, the complement of Clk_In to produce complement outputs 540 spanning at least 180° of Clk_InB 520. In FIG. 3, each tap 340 in the delay chain produces a delayed same polarity edge using two inverters between taps. However, due to the presence of the chain of simultaneous complementary signals, each delay element, in this case a single inverter, from each chain can serve as a tap input for the blender circuit. For example, if the single delay chain 310 in FIG. 3 had taps 340 producing rising edges every 600 ps using two delay elements, now in FIG. 4 by taking a same polarity output from each chain, 410 and 510, the delay between taps is 300 ps. The number of delay elements over the pair of chains is the same as with a single chain, but each delay is half as long between pairs of the same type of edges, thus allowing increased blender resolution. When using the dual delay chains of FIG. 4, the boundary detector need only detect the 0° and 180° boundaries from the chains. An embodiment of the boundary detector 490 is discussed below in connection with FIG. 9.

FIGS. 11 and 12 make the phase relationships between the taps of the dual chains more clear. In FIG. 11 for ease of discussion it is assumed that each chain, 1500 and 1600, shown in FIG. 12, given certain process, voltage and temperature conditions, spans 245° with 8 taps (seven intervals) and that each tap is 35° (disregarding tap polarity). Certain taps from the true and complement chains are marked on the accompanying phase diagram 1220 with a "T" and "C" respectively. The number following the "T" or "C" indicates the number of the tap on the particular chain, i.e., T5 is the fifth tap on the true chain. To progress through the selectable phases of Clk_In, the selection circuitry starts at 0° from the true chain. In the first selection step, marked S1 in FIG. 11, 35° is selected from the complement chain. The 35° tap is available from the complement chain because Clk_InB is propagating simultaneously in the complement chain. In selection step S2, 70° is selected from tap 3 of the true chain. The alternating of taps from the true and complement chains from steps S3 through S5 continues until 175°, tap 6 of the complement chain, is reached. At this point the boundary detector informs the selection circuitry that the 180° phase boundary is near to the desired phase adjustment. Step 6 is made next and if the desired phase adjustment of Clk_In is between 175° and 180° these taps will be selected for interpolation in the blender circuit. For this case, taps from the same chain are selected for interpolation. Continuing around the phase circle, the next step is S7 in which the 215° tap from the true chain is selected, then S8 in which the 250° tap from the complement chain is selected. Stepping occurs in this fashion from S9 through S11 until the 355° tap is reached on the true chain. The boundary detector informs the selection circuitry that the 0° phase boundary is near. Step S12 is made next and if the desired phase adjustment is between 355° and 0° then these taps are selected for interpolation. Alternatively, the selection circuitry starts at 0° from the true chain but selects the taps in the reverse direction, i.e., making selection steps from S12 to S1 in FIG. 11. Returning to FIG. 4, if the blender produces four equally spaced interpolated outputs as in FIG. 3, then the resolution is increased from 150 ps to 75 ps assuming an inverter as the delay element having a delay of 300 ps. An embodiment of a pair of delay chains suitable for use in FIG. 4 is shown in and discussed below in connection with FIG. 7.

FIG. 5 represents in block 500 the circuitry of FIG. 4. The circuitry shown in FIGS. 2, or 3 could be represented by block 500 as well. FIG. 5 further shows phase detector 610 and up-down counter 620 connected to form a delay locked loop. By feeding back the Clk_Out 660 and comparing its phase to the phase of Clk_In 630, a phase error is determined. The polarity of the phase error instructs up/down counter 620 to increase or decrease its count value and the count value is used to derive a suitable Sel_Cntl signal 670.

The loop in FIG. 5 operates as follows, assuming that the phase difference between input clock Clk_In 630 and output clock Clk_Out 660 is approximately 270° and that the phase boundary of Clk_In within the delay chain must be crossed to bring them into phase alignment. Phase detector 610 detects the large phase error and instructs counter 620 to count up. Circuit block 500 then receives the Sel_Cntl 670 information which instructs selection logic 445 in FIG. 4 to switch consecutively through the taps from the output of the blender circuit to reduce the phase error. Selection logic 445 determines when it gets to the last tap of the blender circuit and a phase error is still present that a different pair of taps from the delay chain is required. It relays a request to alter the selected taps into the blender via signal 483 to selection logic 480. This process continues as selection circuit 480 switches consecutively through the taps from the delay chains.

Finally, when one of the taps to be selected by selection logic 480 is the 180° phase boundary of the input clock, the boundary detector relays this information, via the value of the EOC indicator 495, to selection logic 480 to instruct the logic to choose a tap from the delay chains at the 0° phase boundary. The EOC indicator 695 is also used to update the value of the up-down counter 620 with the 0° phase boundary information. Adjustment continues until the proper set of taps is selected by the selection logic 480 so that selection logic 445 does not relay more requests to switch the taps. Selection logic 445 then continues to step through the taps from the blender circuit 475 until the blender output tap that is closest to the phase of the input clock is found. In an embodiment, such as shown in FIG. 5, the loop constantly adjusts the value in the counter by one count causing the phase of the output to jitter around the desired phase relationship between Clk_In and Clk_Out, assuming that Clk_In is not accidentally aligned with the selected output from circuit block 500. Thus, in the usual situation, Clk_Out will jitter by an amount equal to the resolution of circuit block 500.

FIG. 6 shows an embodiment which employs a loop filter 740 to address this issue. The loop filter, a majority or unanimity detector in some embodiments, processes the output of phase detector 710 so that under some conditions the counter is instructed to maintain its value. Only when a given number of phase detector output samples indicate the same direction of phase error will the loop filter instruct counter 720 to increase or decrease its value. The result is that jitter is reduced but at the cost of slower loop response to a real change in input phase, and possibly no loop response to a change in input phase that is too small too meet the criteria of the loop filter.

In some embodiments it is desirable to remove any accumulated duty cycle error in the selected pair of clocks generated by selection circuitry 350 in FIG. 3. This accumulated error is the result of duty cycle errors of prior circuit stages as well as the error generated in selection circuitry 350. This is accomplished by detecting the duty cycle of one of the outputs of selection circuit 350 and using this information to correct the duty cycle of the selection circuit outputs by adjustments applied directly within the selection circuit. In some embodiments the duty cycle correction is distributed within the various stages of selection circuitry 350 to optimize the correction.

FIG. 13 illustrates an embodiment of the duty cycle correcting selection circuit. In FIG. 13 the duty cycle correcting selection circuit comprises multiplexor 1610, phase splitter 1620, duty cycle error detector 1625 and duty cycle control converter 1615. Multiplexor 1610 receives inputs 1605 from which a selection is to be made. The selected output clock 1630 from the multiplexor 1610 is received by phase splitter 1620 which converts the output to true and complement clocks for use by duty cycle error detector 1625 which receives the pair of clocks 1635 and 1640. Duty cycle error detector 1625 produces a pair of differential error voltages DCC 1650 and DCCB 1645 which are received by duty cycle control converter 1615 which in turn produces pull up bias voltage Vcp 1660 and pull down bias voltage Vcn 1655. Multiplexor 1610 receives the pull up and pull down bias voltages and corrects the duty cycle of the output signal 1630 producing a corrected clock on line 1630. In operation, assuming that the output clock has a high time that is greater than 50%, the duty cycle error detector 1625 determines that the high time of the clock is too large and indicates this condition by setting the DCC signal 1650 to be larger than DCCB signal 1645. Duty cycle control converter 1615 receives the error signals and adjusts, via the bias voltages Vcn and Vcp, both edges of the output signal. The rising edge slew rate is decreased and the falling edge slew rate is increased, thus reducing the high time of the clock. This adjustment continues until the output clock has a high time equal to the low.

In some embodiments it is desirable, also, to correct the duty cycle of the output clock from selection circuit 355 in FIG. 3. Duty cycle detection and correction similar to that which is employed to correct duty cycle errors in selection circuit 350 is used. In some embodiments it is desirable to use a duty cycle correcting amplifier to correct the duty cycle of selection circuits 350 and 355 rather than applying the correction entirely within the selection circuit itself.

In FIG. 4, which depicts the pair of delay chains for the true and complementary input clocks, it is important to have the input clock source from which the true and complementary clocks are derived have a 50% duty cycle. The result is that the complementary clock, Clk_InB has exactly 180° phase relationship with Clk_In, thereby guaranteeing the accuracy of the blender circuit. The 50% duty cycle can be imposed on a source clock by utilizing a duty cycle correcting amplifier which receives the clock and generates the Clk_In and Clk_InB signals for the delay chains.

Blender Circuit

As referred to above in the discussion of FIG. 3, an embodiment of a blender circuit is depicted in FIG. 8. The blender circuit receives a pair of inputs such as the pair, 352 and 354, referred to in FIG. 3, on its inputs 900 and 910 in FIG. 8. The outputs of the blender circuit, shown in FIG. 3 as lines 348, are the BP_1 through BP_5 lines, 981–985, in FIG. 8. The function of the blender circuit is to create a series of outputs that span the phase, Phi_In, between the two inputs to the circuit. Phi_In is measured from one edge (rising or falling) of input Phase_1 to the same type of edge of Phase_2. Ideally, if there are N outputs of the circuit, each output differs from the adjacent output by Phi_In divided by N-1, again measured between edges of the same type.

The circuit in FIG. 8, has five outputs and divides the phase between the inputs into four equal parts. The circuit also adds a fixed delay between the inputs and all of the outputs. This fixed delay in FIG. 8 is equal to the delay of 4 inverter stages. The circuit in FIG. 8 operates as follows, assuming that the inputs are 900 and 910 and the rising edge of Phase_1 leads the rising edge of Phase_2. The first event in the circuit takes place at node 920, which first receives a delayed version of Phase_1 and then an equally delayed version of Phase_2. The inverters 906 and 905 driving node 920 have outputs which oppose each other during the time between Phase_1 and Phase_2. This slows the edge rate of the signal at node 920 such that inverter 908 switches at a phase that is half of the phase between signals 915 and 916. This results in node 925 being halfway between node 927 and 929 in time.

It can easily be seen by one skilled in the art that a similar effect will occur at nodes 930 and 940. Node 930 has a signal whose phase is half of the phase between nodes 960 and 970. Node 940 has a signal whose phase is half of the phase between nodes 950 and 970. By the time the signals in the circuit reach nodes BP_1 through BP_5 the phase between the inputs has been divided up into four substantially equal parts. Accuracy is maintained through the circuit by dividing the phase between signals that have an equal delay through the network. Thus, node 925 has been delayed by two inverter stages and node 927 has been delayed by two inverter stages as well. When signals at the two nodes, 927 and 925, are used to create the signal at node 930, only the difference between the phases of the two signals, 927 and 925, is divided into equal parts, the parts eventually becoming the phase differences between BP_1 and BP_2 and between BP_2 and BP_3. All signals thus emerge from the network with a fixed delay of four inverter stages, but with phase differences based on the phase difference of the input signals and not the different propagation paths through the network.

The dividing accuracy can be further improved by controlling the relative strengths of the inverters through the size of the inverter output stage. In all cases, the sum of the sizes of phase-dividing inverters, such as 905 and 906 in FIG. 8, should add up to the size of the buffer inverter, such as 904 in FIG. 8, in order to match delays, assuming that the buffer stages 907, 908 and 909 are identical. In addition, the size of 905 and 906 relative to inverter 904 affects the accuracy of the phase division. In some embodiments for blending with Phase_1 leading Phase_2, the size of 905=0.6*size of 904 and size of 906=0.4*size of 904 to give as close as possible to 50% phase division. In these embodiments, a separate blender would be used for the blending of Phase_2 and Phase_1 with Phase_2 leading Phase_1.

Dual Delay Chains

As referred to above in the discussion of FIG. 4, an embodiment of a delay chain using inverters as delay elements is shown in FIG. 7. Delay chain 820 receives a signal Clk_In 830 and produces a set of taps 800 through 815 called the true clocks which span at least 180° of the input signal. Delay chain 835 receives a signal Clk_InB, which is the complement of the Clk_In signal, and produces a set of taps 850 through 865 called the complement clocks which also span at least 180° of the input signal. Taps 800 through 815 correspond to taps 440 shown in FIG. 4 and taps 850 through 865 correspond to taps 540 in FIG. 4. As shown in FIG. 7, each tap from the chain of inverters 820 or 825 is buffered to prevent loading of the tap from affecting subsequent taps in the chain. Each tap has an output that is delayed by a given number of inverter delays from the input such that the delay between each tap is exactly an inverter delay.

Boundary Detector

As referred to above in the discussion of FIG. 4, an embodiment of the boundary detector 490 is shown in FIGS. 9 and 10. FIG. 9 also shows delay chains 410 and 510 from FIG. 4 to illustrate the operation of the boundary detector better. The pair of delay chains 410 and 510 receive and propagate the input clocks 430 (Clk_In) and 520 (Clk_InB) to outputs 1000–1015 (taps 440 of FIG. 4) and 1050–1065 (taps 540 of FIG. 4). Storage devices 1200 through 1215 are connected to those outputs of the chains that produce rising edges (the outputs of the chain that produce falling edges, such as 1001 and 1050, are not used by the boundary detector). Signal 1030, Clk_In, is connected to the clocks of all the devices 1200–1215 (as shown the storage devices are D flip-flops). In operation, each storage device is clocked by Clk_In to determine whether the tap that is connected to the storage device is a zero or a one. The particular storage device that registers a one indicates that the tap to which it is connected is delayed by more than 180° from the Clk_In signal. Taps in the chain at less than 180° register a zero. Thus, the outputs, Code <15:0>, of the storage devices form a thermometer code. The place in the code where there is a transition point from a zero to a one marks the particular tap at which the 180° phase point of Clk_In has been reached. In other embodiments, a single delay chain having storage devices connected to the taps producing rising edges is used to create the thermometer code.

The thermometer code is further processed by logic as shown in FIG. 10 to create the EOC indicator to be used in FIG. 4. The post-processing of the thermometer code converts the code into an address t<n:0> indicating the tap whose signal is closest to the phase boundary being detected. This address is used as the EOC indicator. Because the relationship of the D inputs and the clock inputs at the storage devices is unknown, it is possible for one of the storage devices to become metastable and eventually settle with an incorrect value causing an error in the code. For example, a code such as 0000000101111111 indicates a boundary exists but the exact point is ambiguous due to the metastability of the storage device. The first "1" and the subsequent "0" present an ambiguous position for the EOC indicator. The post-processing logic is designed to remove this ambiguous position from the code. In the example given, the post-processing logic will determine that the first "1" is the EOC indicator to reduce the chance of picking a point in the delay line that is just beyond the boundary. Choosing a point beyond the boundary may produce a delay adjustment with a large error that would have to be corrected resulting in a non-monotonic delay adjustment process. In some embodiments the first bit in the thermometer code is ignored because of the high likelihood that the first storage device may become metastable and settle to an incorrect value.

Duty Cycle Correcting Selection Circuitry

FIGS. 14 through 17 show embodiments of the various circuit blocks shown in FIG. 13. FIG. 14 shows an embodiment of multiplexor 1610 in FIG. 13. In FIG. 14 sixteen inputs 2040 are received by the multiplexor (2000–2015) and one of them is selected for output signal 2035. The pull up and pull down bias voltages are applied to the various four-to-one multiplexors shown, thus distributing the correction over multiple elements 2020, 2025 and 2030 in the circuitry rather than just the element driving the output signal. By distributing the duty cycle correction over multiple elements in the circuit improved correction range is obtained without adversely affecting waveform quality.

FIG. 15 shows an embodiment of one of the multiplexor elements shown in FIG. 14 in which duty cycle correction is performed. FIG. 15 shows a four-to-one multiplexor having inputs 2100 and output 2165. Inputs 2100 are received by transmission switches 2105, 2110, 2115 and 2120. The selected input is then fed to inverter 2125 which is a device with small output transistors. This allows the output of inverter 2125 at node X to be influenced by transistors 2130 and 2135. These transistors receive, respectively, the pull up bias voltage 2145 and pull down bias voltage 2150. The transistors operate either to decrease the fall time and increase the rise time of the output (if the output has a high time greater than 50%) or to increase the fall time and decrease the rise time of the output (if the output has a low time greater than 50%). Buffer 2140 receives the slew-rate altered signal and produces the corrected output 2165.

Block 2160 in FIG. 15 contains the active duty cycle correction circuitry of the multiplexor elements. Even numbers of blocks coupled directly or indirectly in series with 2160 may be employed to correct the duty cycle with the advantage that pairs of blocks introduce substantially less duty cycle error than using a single block for correction even under of the worst case process conditions. This advantage is due to the second block in the pair having a cancelling effect on the errors inherent in the inverter of the first block of the pair.

FIG. 17 shows an embodiment of duty cycle error detector 1625 shown in FIG. 13. This device functions to produce differential error signals DCC 2385 and DCCB 2380 from differential clock inputs 2305 and 2310. The clock signals 2305 and 2310 are received by a source coupled differential pair designed to steer current sources 2330 and 2335 to or from nodes 2340 and 2345. Differential signals 2380 and 2385 are developed by a load circuit comprising load impedances 2360 and 2365 and integrating capacitances 2370 and 2375. If the input clocks 2305 and 2310 have 50% duty cycles then no differential voltage between signals DCC 2385 and DCCB 2380 is developed. However, if for example Clock 2305 has a high time greater than 50%, then signal DCC 2385 will become more positive than DCCB 2380 because current source 2335 will be applied to integrating capacitance 2375 for a slightly longer time than current source 2330 will be applied to integrating capacitance 2370. Load circuits 2360 and 2365 are high impedance loads to prevent leakage of current from integrating capacitors 2370 and 2375. Another embodiment of a duty cycle error detector is shown in FIG. 18. The circuit in FIG. 18 receives the complementary clock signals 2410 and 2510 on the gates of transistors 2430 and 2450. Differential error signals are developed on the drains of the transistors 2430 and 2450. Devices 2420, 2470, 2480, and 2490 form a high impedance load for each of the transistors 2430 and 2450 so that charge leakage from capacitor 2460 is reduced. In operation capacitor 2460 is alternately charged in one direction and then in the opposite direction. If the duty cycle of the complementary input clocks is 50% then zero net charge results across capacitor 2460 because the charging time in each direction is equal. If clock input 2410 has a duty cycle greater than 50% then node DCC becomes more positive than node DCCB indicating a duty cycle error.

FIG. 16 shows an embodiment of duty cycle control converter 1615 in FIG. 13. This circuitry receives the duty cycle error signals DCC 2225 and DCCB 2235 to produce pullup bias voltage Vcp 2275 and pull down bias voltage Vcn 2270. The duty cycle error signals are received by source coupled differential pair 2226 and 2236 having diode connected loads 2220 and 2230. Current mirror transistors 2210 and 2240 replicate the current flowing past Nodes A and B shown in FIG. 16. This reflected current is then converted into bias voltage Vcn 2270 at the drain of transistor 2215 and bias voltage Vcp at the drain of transistor 2255. If the high time of the clock is greater than 50% then DCC is more positive than DCCB. This causes the voltage at Node A to fall and the voltage at node B to rise. Due to the action of mirror transistor 2210 the bias voltage Vcn 2270 rises towards VDD rail thus driving the pull down transistor 2135 in FIG. 15 harder. At the same time Node B rising causes mirror transistor 2240 to produce a less positive voltage at Node D and a more positive bias voltage Vcp 2275 at the drain of 2255. The more positive bias voltage Vcp weakens the drive of pull up transistor 2130. The result is that the rising edge of the clock signal at Node X in FIG. 15 is slower and the falling edge is faster. Both edges are corrected such that the high time of the corrected clock is reduced to approximately 50%. In alternate embodiments buffering structures comprising 2280 and 2285 can amplify the bias voltages Vcn 2270 and Vcp 2275 a desired amount necessary to control the pull up and pull down transistors in FIG. 15. The complementary voltages to Vcn and Vcp are also available from the buffering structures if needed.

What is claimed is:

1. A circuit for adjusting the phase of an incoming periodic signal comprising:

a delay chain, coupled to receive said incoming periodic signal and having a plurality of taps;

a desired delay adjustment input;

a boundary detector coupled to a plurality of said taps and configured to indicate at the boundary detector output which tap is at a specified signal transition of said incoming periodic signal; and a selection circuit, coupled to said taps, said desired delay adjustment input and said boundary detector, said selection circuit being configured to select a tap based on said desired delay adjustment input and said boundary detector output.

2. The circuit of claim 1 wherein said delay chain includes only a number of delay elements necessary to span one period of a predefined slowest incoming periodic signal.

3. The circuit of claim 1 further comprising:
a blender circuit, coupled to said taps, and configured to phase blend taps from a pair of selected outputs of the delay chain.

4. The circuit of claim 3 wherein said blender circuit includes:
a first inverter connected to a first tap of said plurality of taps;
a second inverter connected to a second tap of said plurality of taps; and
a third inverter having an input coupled to outputs of said first and second inverters, said third inverter producing a blended phase at its output.

5. The circuit of claim 1 wherein said boundary detector comprises:
a plurality of edge-clocked storage elements, each storage element being coupled to one of said taps, the outputs of said storage elements providing a thermometer code.

6. A circuit for adjusting the phase of an incoming periodic signal comprising:
a delay chain, coupled to receive said incoming periodic signal and having a plurality of taps, wherein said delay chain comprises a pair of first and second delay chains, each delay chain spanning at least half a period of said incoming periodic signal, said first delay chain receiving the incoming periodic signal and the second delay chain receiving a complement of the incoming periodic signal;
a desired delay adjustment input;
a boundary detector coupled to a plurality of said taps and configured to indicate at the boundary detector output which tap is at a specified phase boundary of said incoming periodic signal; and
a selection circuit, coupled to said taps, said desired delay adjustment input and said boundary detector, said selection circuit being configured to select a tap based on said desired delay adjustment input and said boundary detector output.

7. The circuit of claim 6 further comprising:
a blender circuit, coupled to said taps, and configured to phase blend signals from a pair of selected taps, said pair including a tap from each of said first and second delay chains.

8. A circuit for adjusting the phase of an incoming periodic signal comprising:
a delay chain, coupled to receive said incoming periodic signal and having a plurality of taps;
a desired delay adjustment input;
a boundary detector coupled to a plurality of said taps and configured to indicate at the boundary detector output which tap is at a specified phase boundary of said incoming periodic signal;
a selection circuit, coupled to said taps, said desired delay adjustment input and said boundary detector, said selection circuit being configured to select a tap based on said desired delay adjustment input and said boundary detector output; and
a duty cycle correction circuit, coupled to the selection circuit.

9. The circuit of claim 8 wherein said duty cycle correction circuit varies a pull-up bias voltage and a pull-down bias voltage connected to the selection circuit.

10. The circuit of claim 8 wherein said selection circuit comprises a multi-level multiplexer, and said duty cycle correction circuit is connected to provide a portion of a duty cycle correction to each of a plurality of levels of said multi-level multiplexer.

11. A circuit for delay adjusting an incoming periodic signal, comprising:
a delay chain having a plurality of output taps and an input for receiving the incoming periodic signal, the delay chain producing at the output taps a set of increasingly delayed versions of the incoming periodic signal, the delayed versions spanning at least the period of the incoming periodic signal;
a boundary detector, coupled to receive the incoming periodic signal and coupled to the taps, the boundary detector generating a signal transition indication at a boundary detector output in response to the incoming periodic signal, the signal transition indication occurring when a signal at one of the taps is adjacent a signal transition of the incoming signal; and
a selection circuit, coupled to (i) a selection input providing selection information specifying a desired delay adjustment of the incoming periodic signal, (ii) the output taps of the delay chain, and (iii) the boundary detector output, the selection circuit selecting as an output the signal of one of the taps in response to the selection information and the signal transition indication, such that the delay of the incoming signal is adjustable across its phase boundaries.

12. A circuit for delay adjusting an incoming periodic signal, comprising:
a delay chain having a plurality of output taps and an input receiving the incoming periodic signal, the delay chain producing at the taps a set of increasingly delayed versions of the incoming periodic signal, the delayed versions spanning the period of the incoming periodic signal;
a boundary detector having inputs for receiving the incoming periodic signal and the signals at the taps, the boundary detector generating a signal transition indication when a signal at one of the taps is adjacent a signal transition of the incoming periodic signal;
a first selection circuit having (i) an input for receiving selection input information specifying a delay adjustment of the incoming periodic signal and (ii) an input for receiving the signal transition indication, the first selection circuit selecting two from the set of delayed versions of the incoming periodic signal based on the signal transition indication and the selection input information;
a blender circuit having inputs for receiving (i) the two selected and (ii) delayed versions of the incoming periodic signal, the blender circuit producing a set of interpolated outputs which span a delay between the two selected, delayed versions of the incoming signal; and
a second selection circuit having inputs receiving the selection input information, the second selection circuit selecting one of the interpolated outputs based on the selection input information and for providing the delay adjusted periodic signal as the selected one of the interpolated outputs.

13. A delay lock loop circuit for an incoming periodic signal, comprising:
a delay circuit including
a delay chain, coupled to receive said incoming periodic signal and having a plurality of taps,
a desired delay adjustment input, a boundary detector coupled to a plurality of said taps and configured to indicate at a boundary detector output which tap is at a specified phase boundary of said incoming periodic signal, and a selection circuit, coupled to said taps, said desired delay adjustment input and said boundary detector, said selection circuit being configured to select a tap based on said desired delay adjustment input and said boundary detector output;

a phase detector coupled between an input and an output of said delay circuit; and an counter having an output coupled to said desired delay adjustment input, a first input coupled to said phase detector and a second input coupled to said boundary detector output.

14. The circuit of claim 13 further comprising:

a filter coupled between said phase detector and said counter.

15. A method for delaying an incoming periodic signal, the method comprising the steps of:

receiving the incoming periodic signal and producing a set of increasingly delayed versions of the incoming periodic signal, the delayed versions spanning at least the period of the incoming periodic signal;

generating a signal transition indication when one of the delayed versions of the incoming periodic signal is adjacent a signal transition of the incoming periodic signal;

receiving selection input information specifying a delay adjustment of the incoming periodic signal; and selecting one of the delayed versions of the incoming periodic signal based on the selection input information and the signal transition indication, such that the delay of the incoming signal is adjustable across its phase boundaries.

16. A method for delaying an incoming periodic signal, the method comprising the steps of:

receiving the incoming periodic signal and producing at least one set of increasingly delayed versions of the incoming periodic signal, the delayed versions spanning the period of the incoming periodic signal;

generating a signal transition indication when one of the delayed versions of the incoming periodic signal is adjacent a signal transition of the incoming periodic signal;

receiving selection input information specifying a delay adjustment of the incoming periodic signal; and selecting two delayed versions of the incoming periodic signal based on the signal transition indication and the selection input information;

producing a set of interpolated outputs which span a delay between the two selected, delayed versions of the incoming signal; and selecting one of the interpolated outputs based on the selection input information.

\* \* \* \* \*